United States Patent
Barnett et al.

(10) Patent No.: US 6,329,949 B1
(45) Date of Patent: Dec. 11, 2001

(54) TRANSCEIVER STACKED ASSEMBLY

(75) Inventors: Ron Barnett, Santa Rosa, CA (US); Ilya Alexander Korisch, Somerset, NJ (US); Zhengxiang Ma, Summit, NJ (US); Richard F Schwartz, Cranbury, NJ (US); Hui Wu, Union, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/523,913

(22) Filed: Mar. 9, 2000

(51) Int. Cl.[7] .................................................. H01Q 1/38
(52) U.S. Cl. ............................ 343/700 MS; 343/702; 343/841; 333/202
(58) Field of Search ........................... 343/700 MS, 702, 343/841, 872, 846; 333/202, 206, 207; 455/90

(56) References Cited

U.S. PATENT DOCUMENTS

| | | | |
|---|---|---|---|
| 3,104,362 | 9/1963 | Matthaei | 333/73 |
| 4,339,628 | 7/1982 | Marcantonio et al. | 174/35 |
| 5,023,866 * | 6/1991 | De Muro | 370/24 |
| 5,045,824 * | 9/1991 | Metroka | 333/206 |
| 5,225,799 | 7/1993 | West et al. | 333/202 |
| 5,231,407 * | 7/1993 | McGirr et al. | 343/700 MS |
| 5,352,996 | 10/1994 | Kawaguchi | 333/203 |
| 5,400,039 | 3/1995 | Araki et al. | 343/760 |
| 5,512,901 * | 4/1996 | Chen et al. | 342/175 |
| 5,777,856 | 7/1998 | Phillips et al. | 361/816 |
| 5,874,920 | 2/1999 | Aracki et al. | 343/702 |
| 6,005,455 | 12/1999 | Lindell et al. | 333/134 |

FOREIGN PATENT DOCUMENTS

| | | | |
|---|---|---|---|
| 0766333 | 2/1997 | (EP) | H01P/1/202 |
| 2673496 | 9/1992 | (FR) | H04B/1/03 |

* cited by examiner

Primary Examiner—Tho Phan
(74) Attorney, Agent, or Firm—Davik Volejnicek

(57) ABSTRACT

A transceiver (100) comprises a stacked metal laminate assembly of a plurality of layers (104–112) inside an enclosure (102). A first layer (104) forms an antenna. A second layer (106) forms a ground plane for the antenna. A third layer (108) forms "front-end" filters (duplexer). A fourth layer (110) together with the second layer forms an electromagnetic isolation enclosure for the filters. A fifth layer (112) comprises a PC board with electronic circuits of the transceiver mounted thereon, and is both mounted to and electronically shielded by the fourth layer. Each of the first through fourth layers is preferably made from a single metal layer, such as a sheet of metal, by stamping. Each of the first through fourth layers is either bent along its periphery into a substantially "cake-pan" shape, or is flat and has a separate side wall (130) attached thereto. Flanges (122 and 124) that are unitarily formed with the filters extend through orifices (126 and 128) in the second and fourth layers to connect the filters with the antenna and the electronic circuits. The connections may be conductive or capacitive. The assembly is put together by stacking the first through fourth layers and then epoxying, soldering, or welding them together.

22 Claims, 6 Drawing Sheets

TRANSCEIVER STACKED ASSEMBLY

CROSS-REFERENCE TO RELATED APPLICATION

Barnett et al. "Electronic Stacked Assembly", U.S. application Ser. No. 09/521,935, filed on even date herewith and assignee to the same assignee, shares herewith a substantially common disclosure.

TECHNICAL FIELD

This invention relates to the structure and manufacturing of wireless transmitters and/or receivers.

BACKGROUND OF THE INVENTION

Transmitter and/or receiver (henceforth referred to generically as "transceiver") technology has evolved over the decades from the use of wires, electro-mechanical components, and machined waveguide structures to the use of coax and thick film/thin film microstrip/stripline-based circuitry. But even with this evolution, the recent proliferation of, and resulting stiff competition among, wireless communications products have led to price/performance demands on transceivers that conventional technologies find difficult to meet. A transceiver conventionally comprises a protective enclosure, an antenna, "front end" filters (e.g., a duplexer), amplifiers and other transceiver circuitry, and connectors and cabling. The most expensive components typically are the antenna, the filters, and the amplifiers. To permit obtaining these components from different sources, to permit easy interconnection of these components, and to permit easy testing and alignment, the electrical interfaces between the components have been standardized at 50Ω and are generally made via 50Ω coaxial cables and connectors. These components not only add to the cost of the transceiver, but also reduce the overall performance thereof. Moreover, the impedance conversion required to achieve 50Ω adds cost and degrades the performance of the active components of the transceiver.

High-volume manufacturing techniques have been used to reduce the costs of some conventional antennas and filters. However, these techniques do nothing to improve the performance of these components, nor do they improve the costs of low- and medium-volume components. Moreover, they do nothing to reduce the amount and the cost of cabling and connectors between the antenna and the filters. Others have sought to reduce the cost of antennas and filters at the expense of other parts of the transceiver; essentially, by shifting the cost to these other parts. One example is replacing standard front-end components with ones that have a better performance to make up for the poor performance of cheap antennas and filters, such as replacing the low-noise pre-amplifier (LNA) with one that has a lower noise figure and a higher dynamic range (i.e., higher 1-dB compression or higher third-order intercept (TOI)), or replacing the output power amplifier (PA) with one that has a higher output power. The problem with these approaches is that they merely transfer the cost to another area of the transceiver without substantially lowering the cost of the transceiver as a whole. In fact, they generally increase the complexity and the cost of the transceiver.

SUMMARY OF THE INVENTION

This invention is directed to solving these and other problems and disadvantages of the prior art. Generally according to the invention, the antenna and the "front end" filters of a transceiver are integrated into a single multi-layer structure that decreases complexity and transceiver cost and improves transceiver performance. The transceiver is constructed as a stacked assembly of its constituent parts, with some parts performing "double duty" in the assembly, thereby decreasing its complexity and cost. For example, the antenna and "front-end" filters of the transceiver are integrated into one metal laminate assembly such that shielding of the filter forms a ground plane of the antenna, thereby decreasing transceiver complexity and cost. Moreover, the assembly is simple and inexpensive to put together, and at the same time improves transceiver performance. Preferably, the circuit board that carries the transceiver circuitry is also integrated into the structure such that the shielding of the filter forms both a mount for the circuit board and a shield for the circuitry.

Specifically according to the invention, a transceiver stacked assembly comprises at least four layers: a first layer that forms an antenna, a third layer that forms one or more "front-end", or radio frequency (RF) filters, a second layer interposed between the antenna and the filters that forms a ground plane of the antenna as well as a part of an electrical isolation enclosure for the filter, and a fourth layer that together with the second layer forms the electromagnetic isolation enclosure of the filter. The layers are stacked next to ("on top of") each other and are preferably epoxied, soldered, or welded together. Each layer preferably comprises a single metal layer. Illustratively, the first layer including the antenna is stamped out of a single sheet of metal, as is the third layer including the filters. Also, each layer preferably has a cake-pan shape, forming walls that both space the rest of the layer from an adjacent layer and mount the layer on the adjacent layer. The filters and the antenna are conductively or capacitively interconnected in a connectorless manner—illustratively by flanges that extend through orifices in the second layer and that are preferably made integrally with the filters or the antenna—thus eliminating the use of conventional connectors and cables. Further preferably, a fifth layer that defines the electronic circuitry of the transceiver, such as a printed circuit board with electronic components mounted thereon, is mounted to and electromagnetically shielded by the fourth layer. The electronics and the filters are conductively or capacitively connected together by flanges that extend through orifices in the fourth layer and that are preferably made integrally with the filters, again eliminating the use of conventional connectors and cables.

The invention has numerous benefits. For example, designing the antenna and filters as one common assembly (one unit) introduces design options or degrees of freedom not possible with separate, discrete, antennas and filters. To illustrate, the filters and the antenna need not have a 50Ω input and output impedance; rather, the impedance can be whatever yields the best performance, since both the antenna and filter performance are under control of the same designer. Also, the connection from the filters to the radio need not be 50Ω, but can be separately optimized to a non-50Ω impedance to advantageously match to a particular design. Furthermore, functions (e.g., the combiner) that are normally associated with the duplexer can be designed into the antenna, and vice versa. The invention yields lower losses and improved performance than conventional designs, due to the all-metal design. The noise figure of the transceiver can likewise be improved. Elimination of connectors and cabling between the antenna, filter, and PC board also reduces transceiver costs and increases transceiver reliability. Also, precise control of the interconnection leads to better performance. Moreover, the integrated antenna and filter assembly can be manufactured more easily, as one unit. On balance, the invention yields a transceiver with fewer parts, a simpler mechanical structure, fewer manufacturing steps, and easier assembly.

These and other features and advantages of the invention will become more apparent from the following description of an illustrative embodiment of the invention considered together with the drawing.

DETAILED DESCRIPTION

Figure 1:
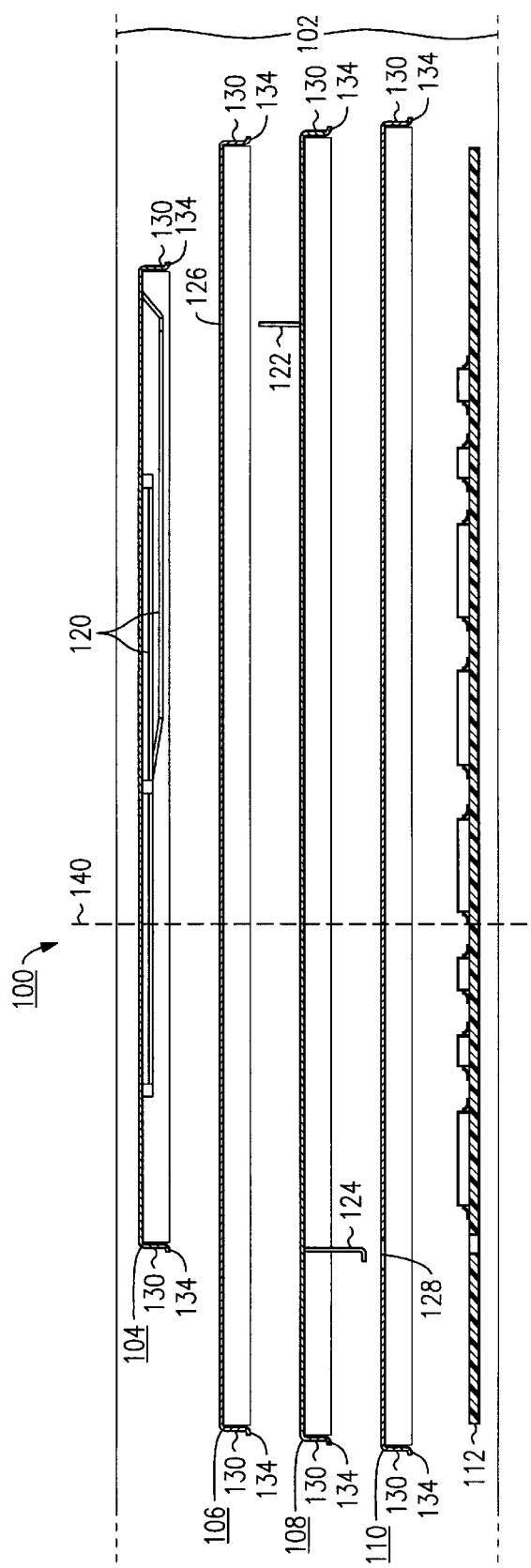
FIG. 1 is an exploded side view of a transceiver stack assembly that includes an illustrative embodiment of the invention.
Figure 6:
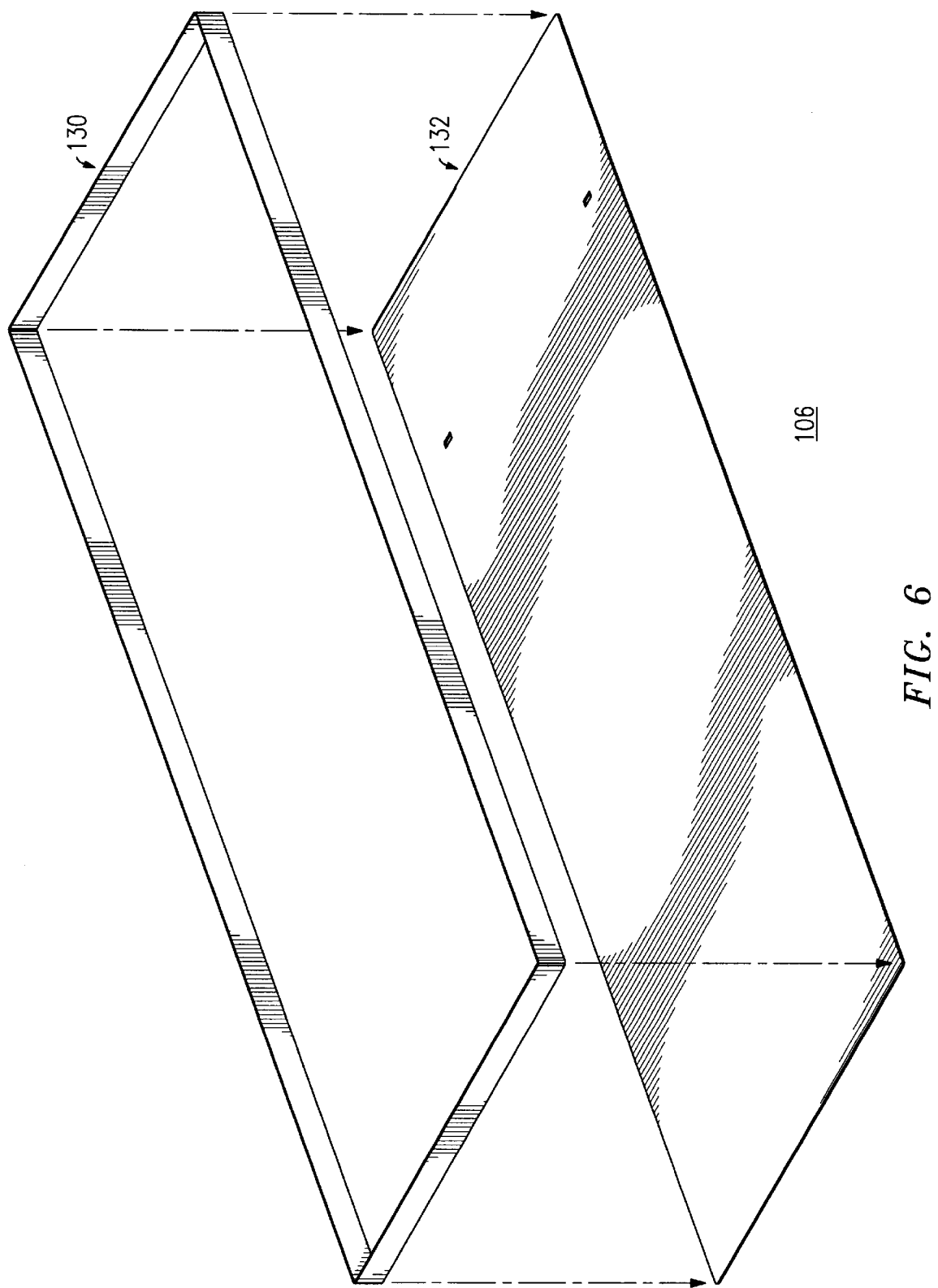
FIG. 6 is an exploded perspective view of an alternative embodiment of a layer of the transceiver stack assembly of FIG. 1.

FIG. 1 shows an exploded front view of a stack assembly 104–112 of a transceiver 100. Transceiver 100 may be any desired device, e.g., a wireless communications system base station or user terminal. While transceiver 100 is used as an example herein, the invention may be employed in any electronic stack assembly. Stack assembly 104–112 may be mounted inside an electromagnetically permeable protective enclosure 102, e.g., a plastic case, as is conventional, and comprises a plurality of units, or layers 104–112, that are oriented to all face in the same direction and are stacked one on top of another along an axis 140 and are attached together, e.g., by soldering, welding, or mechanical attachment such as riveting or adhering with adhesive (e.g., epoxying, with conductive or nonconductive epoxy). The layers are: an antenna layer 104, which includes the antenna distribution network 120; an upper reflector layer 106 that acts as a ground plane for the antenna of layer 104; a filter layer 108 that comprises "front-end" filters (a duplexer); a lower reflector layer 110 that together with upper reflector layer 106 acts as an electromagnetically shielding housing for filter layer 108; and an electronics layer 112 that contains the electronics of transceiver 100 (also referred to as the radio layer) that is mounted on and shielded by lower reflector layer 110. Alternatively, electronics layer 112 may be mounted remotely from filter/antenna stack assembly 104–110, and layer 110 may be just a flat sheet of conductive material. Reuse of elements for multiple purposes, such as the use of layer 106 for both antenna reflection and filter shielding, simplifies the design and makes it less costly to implement. Filter layer 108 includes flanges (or bent tabs) 122 by means of which it connects, through orifices 126 in upper reflector layer 106, to distribution network and combiner 120 of antenna layer 104, and further includes flanges 124 by means of which it connects, through orifices 128 in lower reflector layer 110, to electronics layer 112. Flanges 122 and 124 may provide radiative (connectorless) interconnects to duplexer layer 108, or they may provide conductive interconnection by being directly attached, as by solder, to layers 106 and 110. Not shown in the drawings is a central isolation wall which may be required between the two halves of filter layer 108. Each layer 104–110 is preferably stamped or otherwise cut and folded from a single unitary sheet of electrically conductive material, e.g., a plate of metal, to form a pan-shaped unit. Alternatively, side walls 130 of each layer 104–110 may be made separately from the flat-sheet portion 132 of each layer, e.g., by stamping, molding, or extrusion. Portion 132 forms a plane, and side walls 130 form a closed wall within a plane that is parallel to the plane of portion 132. Portions 132 and side walls 130 are stacked along axis 140 which is perpendicular to their planes and are attached to each other by soldering, welding, or adhering in order to form the pan-shaped unit. Layer 106 that is made in this manner is shown in FIG. 6. The height of side walls 130 may be varied from layer to layer as needed to provide clearance for electronic components, optimum performance, or shielding. Optionally, side walls 130 of each layer 104–110 may include lips 134, shown in FIG. 1, which facilitate the attaching of layers 104–110 to each other. Moreover, due to the peculiarities of the metal-stamping process, the double ("Z"-shaped) bend yields greater precision in the spacing of adjacent layers than would a single bend. As noted previously, layer 110 may just be a flat sheet of conductive material. Layer 112 is illustratively a conventional printed circuit board with electronic components mounted thereon. Stack assembly 104–112 and its component layers are well suited for use with automated (robotic) manufacturing and assembly techniques.

Figure 2:
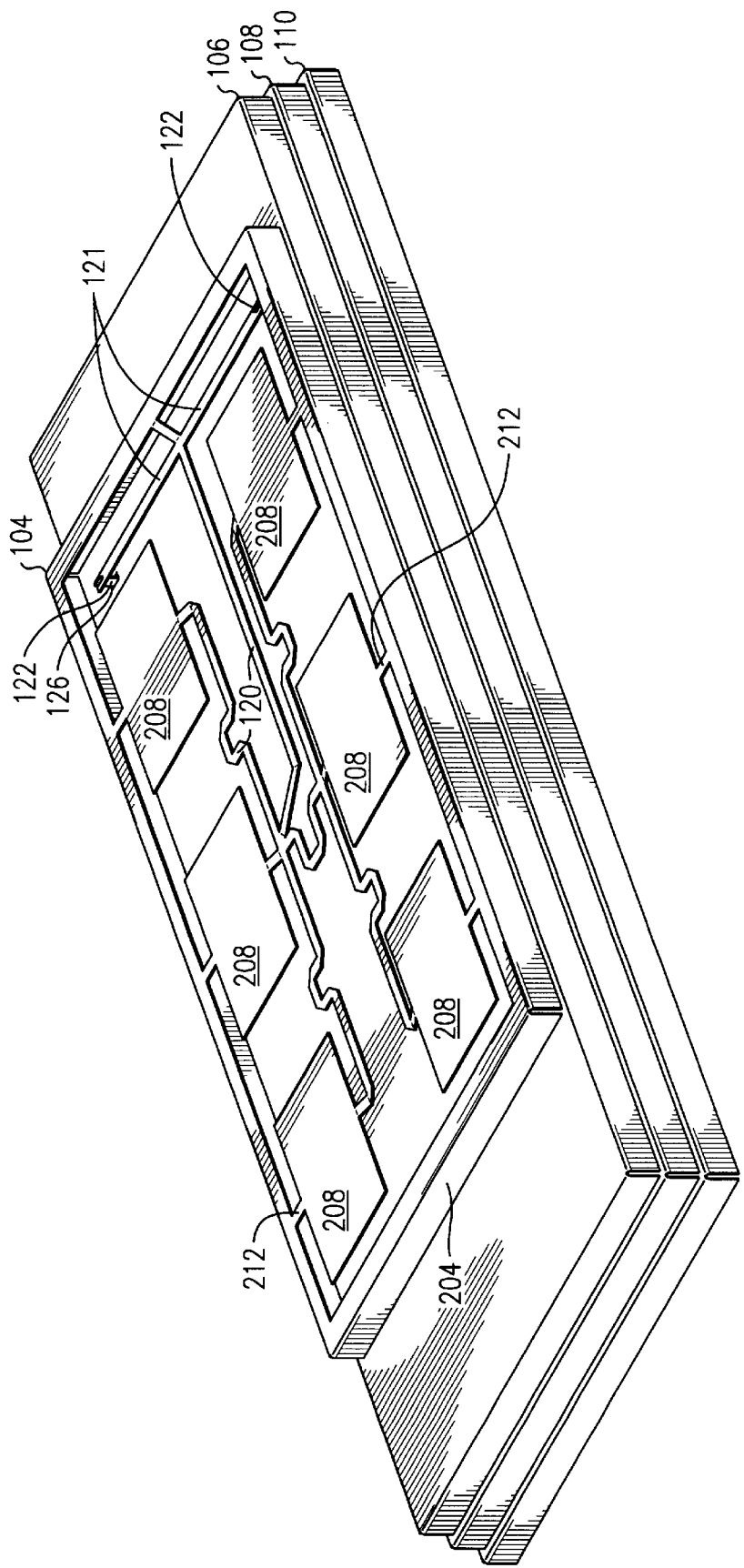
FIG. 2 is a perspective view of the transceiver stack assembly of FIG. 1 and its antenna layer.

FIG. 2 shows a perspective view of stack assembly 104–112 (without flanges 134) of FIG. 1, and shows details of antenna layer 104. Antenna layer 104 comprises a frame 204 and a patch array inside of frame 204. Patch array comprises a plurality of radiative elements 208 each connected to frame 204 by a support 212 and interconnected in parallel by a feed network 120. The length of supports 212 is preferably one-quarter wavelength of the main operating frequency of transceiver 100, so as not to perturb the electrical performance of radiative element 208. Advantageously, feed network 120 includes a "T"-shaped combiner 121, which in conventional architectures forms a part of the duplexer (layer 108). Because the antenna and the duplexer are integrated herein into a single structure, combiner 121—or any other element, for that matter—may be placed at any layer where it best fits in, i.e., where there is room for it. Frame 204 and the array of radiative elements 208 are preferably of unitary construction, cut, stamped, etched, or otherwise produced from a single sheet of metal. Antenna layer 104 is illustratively the antenna disclosed in the application of R. Barnett et al. entitled "Sheet-Metal Antenna", Ser. No. 09/521,727, filed on even date herewith and assigned to the same assignee.

Flanges 122 of filter layer 108 are coupled to combiner 121 of feed network 120 of the patch array. The coupling may be either conductive, e.g., a solder joint, or capacitive. Frame 204 spaces the patch array away from the antenna ground plane formed by upper reflector layer 106. Air between the ground plane and the patch array forms the dielectric layer of the antenna. Feed network 120 and combiner 121 preferably lie closer to the antenna ground plane than radiative elements 208. This creates a vertical spacing between radiative elements 208 and network 120 and so lessens the requirement for a horizontal spacing between them while maintaining the net spacing between them. Frame 204 is welded, epoxied, soldered, or otherwise attached to upper reflector layer 106. Upper reflector layer 106 is similarly attached to filter layer 108. Upper reflector layer 106 is preferably merely a metal "pan" with orifices 126 for flanges 122 of filter layer 108.

Figure 3:
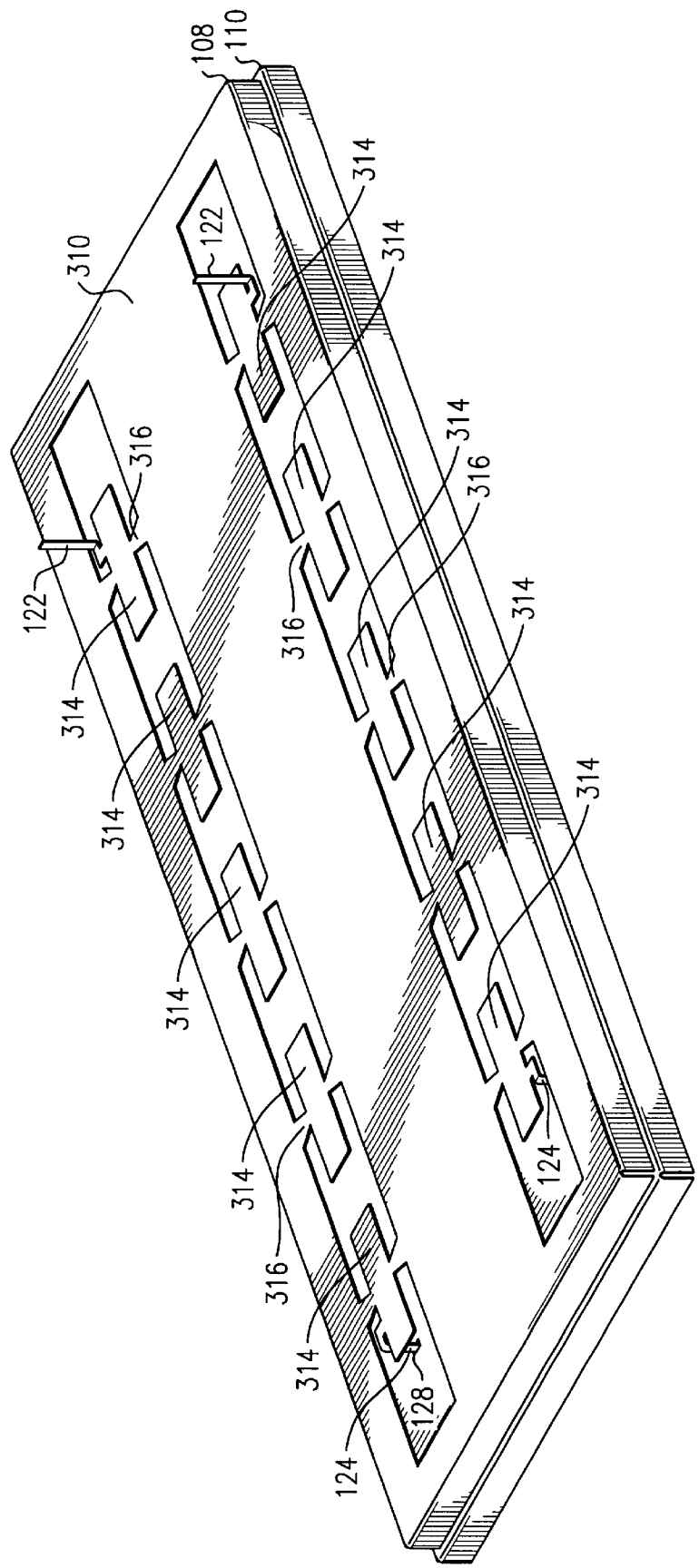
FIG. 3 is a perspective view of a filter layer of the transceiver stack assembly of FIG. 1.

FIG. 3 shows details of filter layer 108. Filter layer 108 comprises a frame 310 and a pair of resonator arrays inside of frame 310. Each resonator array forms a filter and comprises a plurality of resonators 314 each connected to frame 310 by a pair of supports 316. Outermost resonators 314 of each array on one end of filter layer 108 define flanges 122. Outermost resonators 314 of each array on the other end of filter layer 108 define flanges 124. Frame 310 and the resonator arrays including flanges 122 and 124 are preferably of unitary construction, stamped or otherwise produced from a single sheet of metal. Interconnects (flanges 122 and 124) to the filters are thus achieved during normal manufacturing of the filters at no additional cost. Filter layer 108 is illustratively the filter element disclosed in the application of R. Barnett et al. entitled "Sheet-Metal Filter", Ser. No. 09/521,556, filed on even date herewith and assigned to the same assignee.

Frame 310 spaces the resonator arrays away from lower reflector layer 110. Frame 310 is welded, epoxied, soldered, or otherwise attached to lower reflector layer 110. Layers 106 and 110 and frame 310 together form an electromagnetically isolating enclosure for the filters that are formed by the resonator arrays of layer 108. This enclosure may also act as a heat sink for the transceiver circuitry of layer 112. Air inside the enclosure forms dielectric layers of the filters.

Figure 4:
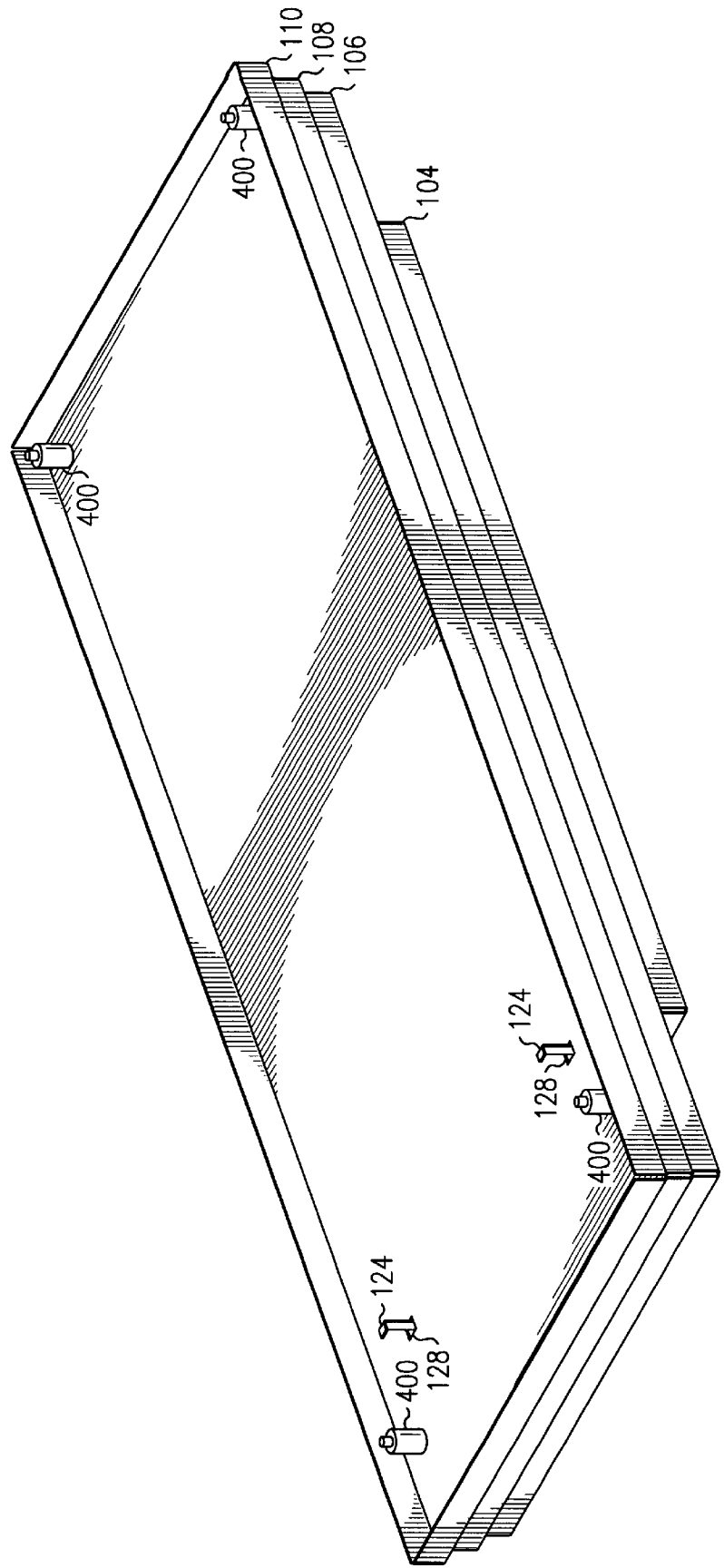
FIG. 4 is a bottom perspective view of the transceiver stack assembly of FIG. 1.

FIG. 4 shows details of the underside of lower reflector layer 110. Layer 110 is preferably merely a metal "pan" with orifices 128 for flanges 124 of filter layer 108. The underside of layer 110 has standoffs (spacers) 400 mounted thereto for mounting electronics layer 112 to layer 110. Flanges 124 of filter layer 108 which protrude through orifices 128 make either physical or capacitive contact with pads 138 (see FIG. 1) of electronics layer 112. Layer 110 also acts as an electromagnetic shield, and optionally as a heat sink, for electronics layer 112.

Figure 5:
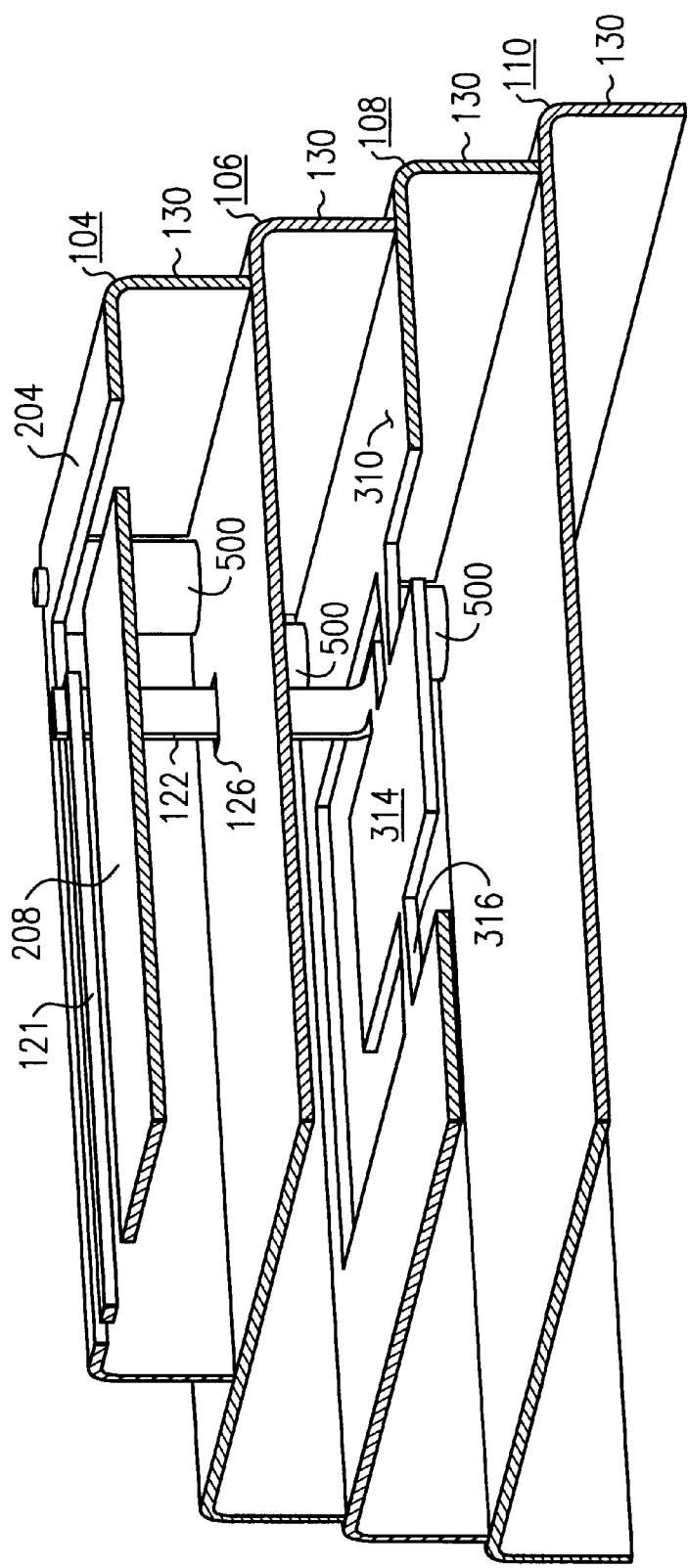
FIG. 5 is a cutaway side perspective view of the transceiver stack assembly of FIG. 1.

FIG. 5 presents a cutaway side perspective view of stack assembly 104–110 that shows in greater detail the intercoupling of layers 104 and 108 that is effected by a flange 122. The coupling structure can bridge fairly wide gaps, either conductively or radiatively. In the radiative coupling, a coupling capacitor (illustratively formed by the tips of flange 122 and combiner 121 which are positioned in proximity to, but do not touch, each other) forms a series inductive-capacitive resonant circuit (or a more-complex but still series resonance type of circuit) together with interconnecting flange 122 (bent up/down strip) and provides very low loss connection near the resonant frequency. This is described in more detail in the application of R. Barnett et al. entitled "Resonant Capacitive Coupler", Ser. No. 09/521,724, filed on even date herewith and assigned to the same assignee. The capacitor therefore provides not just coupling, but in fact compensates for the inductance of interconnecting flange 122. The capacitor in this design can be much smaller (in some cases by an order of magnitude) than a coupling capacitor that would be used conventionally to connect two 50Ω sections, and hence is much easier to implement. This type of connection can be applied to coaxial, two wire, and coplanar waveguide types of interconnecting structures. The capacitor itself may or may not have a dielectric, i.e., the dielectric may be air. The dielectric may be anything from a ceramic to a double-sided adhesive tape, which provides mechanical robustness.

FIG. 5 further shows optional spacers 500 that may be employed between layers 104–110 to ensure proper spacing between the layers. Generally, one spacer 500 would be used in each one of the four corners of layers 104–108, similarly to how standoffs 400 are positioned on layer 110 in FIG. 4. Spacers 500 may be stamped or molded plastic standoffs, or other low-cost precision parts, such as ball bearings, or even electronic components used as spacers.

Of course, various changes and modifications to the illustrative embodiment described above will be apparent to those skilled in the art. For example, the layers may be aligned by use of projecting pins or tabs interlocking into adjacent layers. Proper spacing between layers may be achieved by use of a precision jig during assembly to hold distances correct during soldering or welding. The principles of the stack assembly are applicable to the construction of an antenna alone or a filter alone, or to any other electronic assembly. The lower reflector layer 110 could also be used to provide extra mechanical rigidity for the circuit board of the electronics layer. Or, instead of all of the layers being pan-shaped and all facing in the same direction, some layers may be just flat sheets of conductive material sandwiched between adjacent pan-shaped layers that face each other across the interspaced flat layer. In this case, the assembly may also include adjacent pan-shaped layers that face away from each other and are attached to each other back-to-back (pan bottom-to-pan bottom). Such changes and modifications can be made without departing from the spirit and the scope of the invention and without diminishing its attendant advantages. It is therefore intended that such changes and modifications be covered by the following claims except insofar as limited by the prior art.

What is claimed is:

1. A transceiver stacked assembly comprising:

a first assembly layer comprising a single metal layer forming an antenna;

a third assembly layer connected to the first layer and comprising a single metal layer forming a pair of filters including a transmit filter and a receive filter and further forming a combiner which together with the filters of the third layer forms a duplexer;

a second assembly layer connected to and interposed between the first and the third layers and comprising a single metal layer forming a ground plane of the antenna; and a fourth assembly layer connected to the third layer and comprising a single metal layer forming together with the second layer an electromagnetic isolation enclosure for the filter.

2. The assembly of claim 1 wherein:

a first one of the first and the third layers forms a pair of flanges that extend through the second layer to a second one of the first and the third layers to couple the filters to the combiner.

3. The assembly of claim 1 wherein:

each layer includes walls that serve to connect the layer to an adjacent layer and to space a rest of the layer from the adjacent layer.

4. The assembly of claim 3 wherein:

the walls of each frame include a flange along a periphery of the frame having a width of about one-quarter wavelength of an operating frequency of the transceiver stacked assembly and closely spaced from or contacting the adjacent layer.

5. A method of making the assembly of claim 1 comprising:

stacking the assembly layers adjacent to each other; and one of epoxying, soldering, welding, and mechanically attaching the assembly layers together.

6. The method of claim 5 further comprising:
stamping each assembly layer out of a single sheet of metal.

7. An assembly made by the method of claim 5.

8. A transceiver stacked assembly comprising:
a first assembly layer forming an antenna;
a third assembly layer connected to the first layer and forming a filter;
a second assembly layer connected to and interposed between the first and the third layers and forming a ground plane of the antenna;
a fourth assembly layer connected to the third layer and forming together with the second layer an electromagnetic isolation enclosure for the filter; and
a fifth layer connected to the third and fourth layers and defining electronic circuitry of the transceiver which is electromagnetically shielded by the fourth layer.

9. The assembly of claim 8 wherein:
the first layer comprises a single metal layer forming the antenna;
the second layer comprises a single metal layer;
the third layer comprises a single metal layer forming the filter; and
the fourth layer comprises a single metal layer.

10. The assembly of claim 9 wherein:
the filter of the third layer comprises a pair of filters including a transmit filter and a receive filter.

11. The assembly of claim 9 wherein:
a first one of the first and the third layers forms a flange that extends through the second layer to a second one of the first and the third layers to couple the filter to the antenna.

12. The assembly of claim 9 wherein:
each metal layer is formed from a single sheet of metal into a cake-pan shape.

13. The assembly of claim 9 wherein:
each layer is made by stamping, etching, or mechanically forming the layer from a single sheet of metal.

14. A method of making the assembly of claim 1 comprising:
stamping each single metal layer assembly layer out of a single sheet of metal;
stacking the assembly layers adjacent to each other; and
one of epoxying, soldering, welding, and mechanically attaching the assembly layers together.

15. An assembly made by the method of claim 14.

16. The assembly of claim 8 wherein:
the fifth layer comprises a printed circuit board having electronic components mounted thereon, the printed circuit board being mounted on the fourth layer.

17. The assembly of claim 8 further comprising:
an electromagnetically permeable housing surrounding the assembly of the first through fourth layers.

18. A transceiver assembly comprising:
a first assembly layer comprising a single metal layer forming an antenna;
a third assembly layer connected to the first layer and comprising a single metal layer forming a filter;
a second assembly layer connected to and interposed between the first and the third layers and comprising a single metal layer forming a ground plane of the antenna; and
a fourth assembly layer connected to the third layer and comprising a single metal layer forming together with the second layer an electromagnetic isolation enclosure for the filter; wherein
each metal layer has a unitary construction including a frame formed by a bent periphery of the layer that serves to connect the layer to an adjacent layer and to space a rest of the layer from the adjacent layer.

19. The assembly of claim 18 wherein:
the antenna and the filter are interconnected with each other in a connectorless manner.

20. A transceiver stacked assembly comprising:
a first assembly layer forming an antenna;
a third assembly layer connected to the first layer and forming a filter;
a second assembly layer connected to and interposed between the first and the third layers and forming a ground plane of the antenna;
a fourth assembly layer connected to the third layer and forming together with the second layer an electromagnetic isolation enclosure for the filter; and
a fifth layer connected to the fourth layer and defining electronic circuitry of the transceiver which is electromagnetically shielded by the fourth layer; and wherein
the filter includes flanges bent away from a plane of the third layer,
the second and the fourth metal layers include orifices each having at least one of the flanges extending therethrough,
the flange that extends through the orifice of the second layer connects the filter to the antenna, and
the flange that extends through the orifice of the fourth layer connects the filter to the electronic circuitry.

21. The assembly of claim 20 wherein:
the layers are connected by being one of epoxied, soldered, welded, and mechanically attached together.

22. The assembly of claim 20 wherein:
the flanges effect capacitive-coupling connections to the electronic circuitry and to the antenna.

* * * * *